(12) United States Patent
Chang et al.

(10) Patent No.: US 9,829,806 B2
(45) Date of Patent: Nov. 28, 2017

(54) LITHOGRAPHY TOOL WITH BACKSIDE POLISHER

(71) Applicant: Taiwan Semiconductor Manufacturing Company Limited, Hsinchu (TW)

(72) Inventors: Tang-Kuei Chang, Tainan (TW); Kuo-Hsiu Wei, Tainan (TW); Kei-Wei Chen, Tainan (TW); Huai-Tei Yang, Hsin-Chu (TW); Ying-Lang Wang, Tai-Chung (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/210,619

(22) Filed: Mar. 14, 2014

(65) Prior Publication Data

US 2015/0262831 A1   Sep. 17, 2015

(51) Int. Cl.
  *G03F 7/26*   (2006.01)
  *G03F 7/20*   (2006.01)
  *G03F 7/16*   (2006.01)

(52) U.S. Cl.
  CPC ............ *G03F 7/70733* (2013.01); *G03F 7/16* (2013.01); *G03F 7/26* (2013.01); *G03F 7/70783* (2013.01)

(58) Field of Classification Search
  CPC ........................................................ G03F 7/26
  See application file for complete search history.

(56) References Cited

U.S. PATENT DOCUMENTS

| | | | |
|---|---|---|---|
| 5,780,204 A * | 7/1998 | La | H01L 21/304 257/E21.237 |
| 5,963,315 A | 10/1999 | Hiatt et al. | |
| 6,240,874 B1 | 6/2001 | Pike | |
| 6,361,313 B1 | 3/2002 | Beyaert et al. | |
| 6,767,170 B2 | 7/2004 | Kostler et al. | |
| 2009/0047604 A1 | 2/2009 | Stoeldraijer et al. | |
| 2009/0093776 A1 * | 4/2009 | Yue | A61B 17/3211 604/272 |
| 2010/0002210 A1 | 1/2010 | Hendel et al. | |
| 2011/0254084 A1 * | 10/2011 | Terrill | H01L 29/407 257/330 |
| 2012/0094437 A1 * | 4/2012 | Han | H01L 21/76801 438/109 |
| 2013/0045596 A1 * | 2/2013 | Eda | B24B 37/042 438/692 |
| 2013/0314710 A1 * | 11/2013 | Levy | G01N 21/211 356/402 |
| 2014/0242886 A1 * | 8/2014 | Woo | B24B 41/047 451/286 |

* cited by examiner

*Primary Examiner* — Kathleen Duda
(74) *Attorney, Agent, or Firm* — Jones Day

(57) ABSTRACT

Methods for processing a substrate having a structure formed thereon and a system for processing a substrate are provided. A substrate is received from first processing equipment, where the first processing equipment has formed the structure on the substrate. A lithography process is performed on the received substrate. The lithography process includes exposing the substrate under an optical condition. The lithography process further includes polishing a backside of the substrate prior to the exposing of the substrate, where the polishing is configured to remove a topographical feature of the backside of the substrate or to remove a contaminant from the backside of the substrate. The substrate does not undergo a cleaning procedure during a period of time between i) the forming of the structure on the substrate, and ii) the exposing of the substrate.

21 Claims, 4 Drawing Sheets

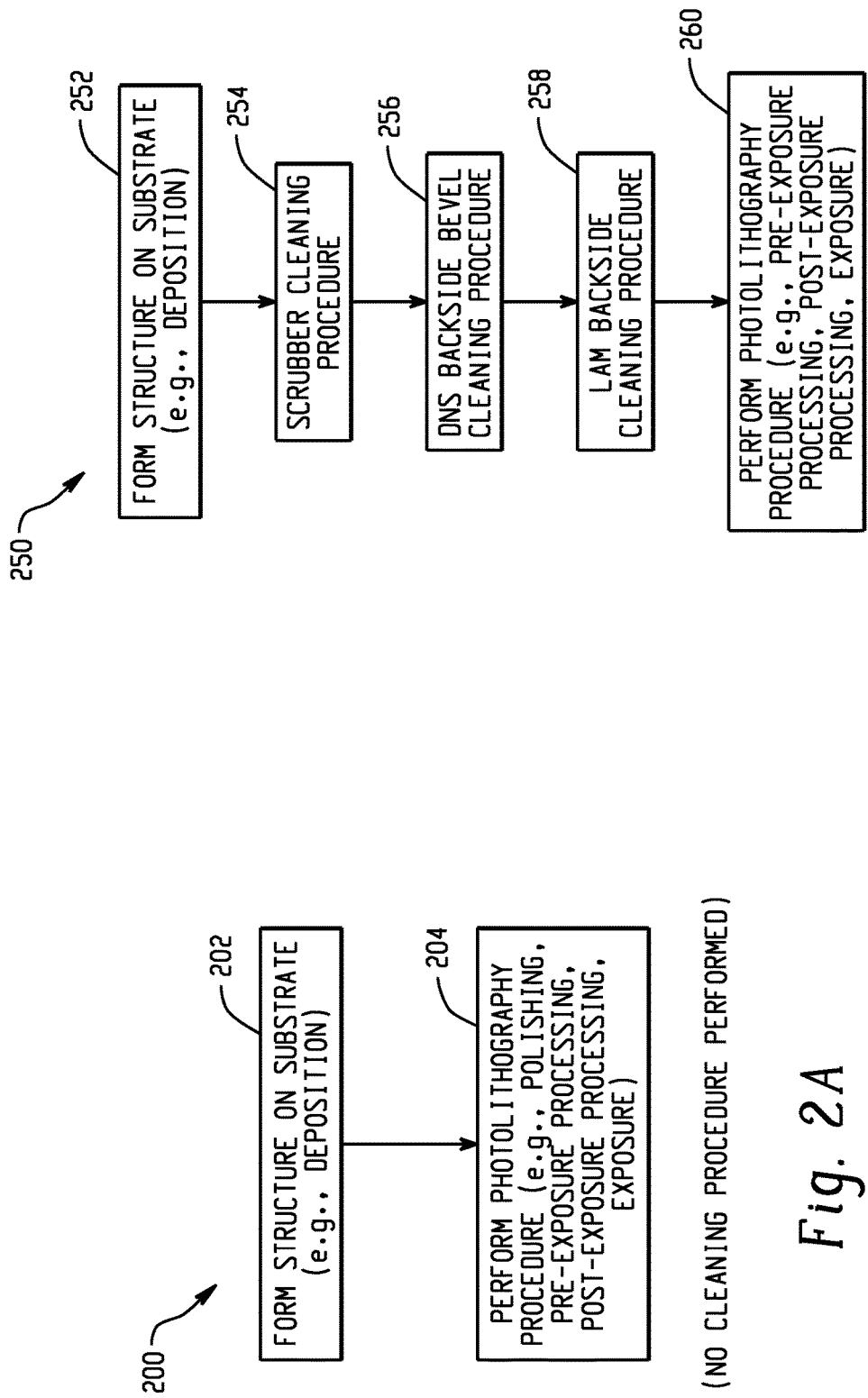

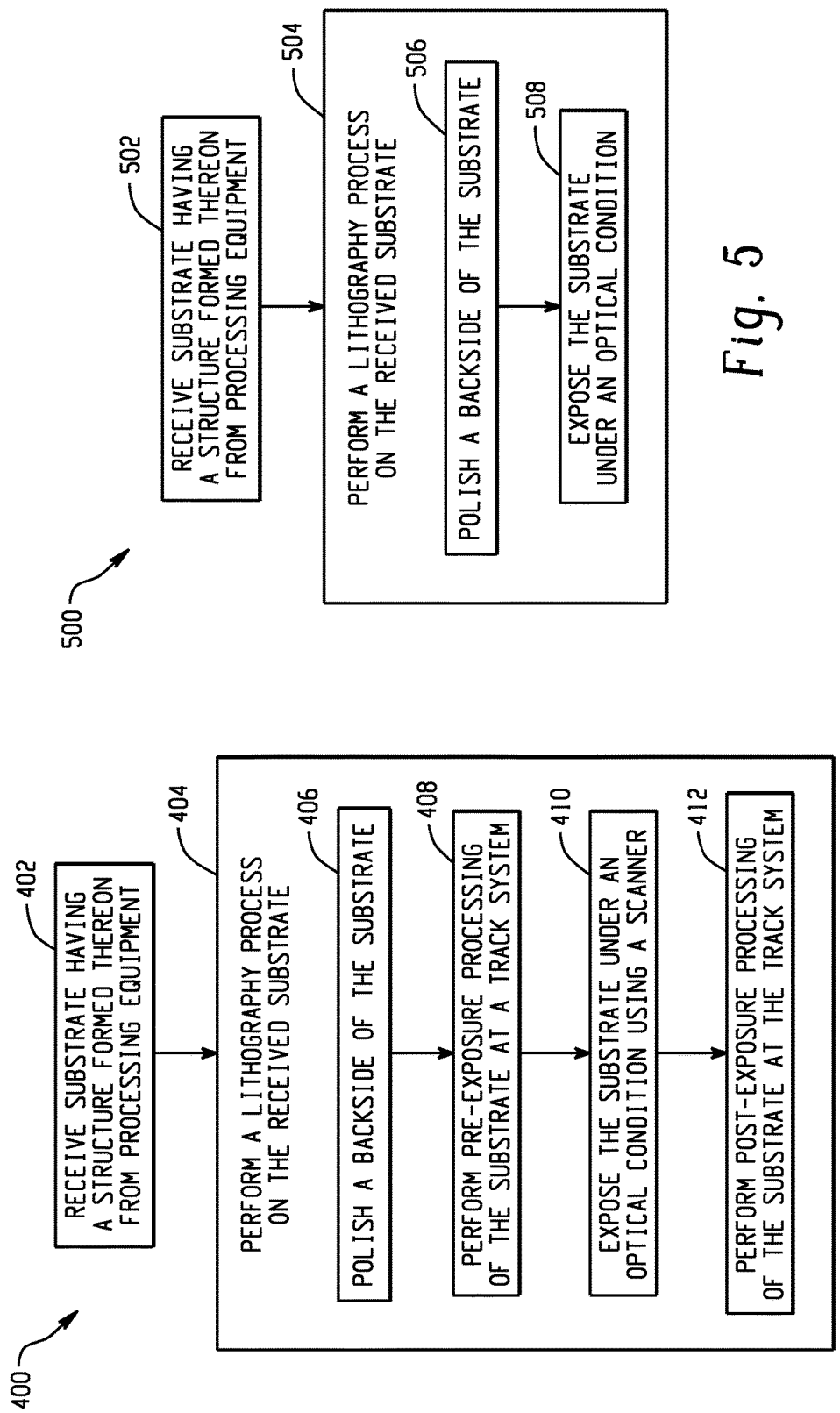

LITHOGRAPHY TOOL WITH BACKSIDE POLISHER

BACKGROUND

A lithography process may be used to create a desired pattern on a semiconductor substrate. The lithography process may be used, for example, in the manufacture of integrated circuits (ICs). In manufacturing ICs using lithography systems, a patterning device (e.g., a mask or a reticle) may be used to generate a circuit pattern to be formed on an individual layer of the IC. The pattern may be transferred onto a target portion of a substrate (e.g., a silicon wafer), where the target portion of the substrate may include part of a device, one device, or several devices. Transferring the pattern may include imaging the pattern onto a layer of radiation-sensitive material (e.g., resist) that is disposed over the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a flowchart that may illustrate an example method for processing a substrate having a structure formed thereon, in accordance with some embodiments.

FIG. 2B is a flowchart that may illustrate an alternative method for processing a substrate having a structure formed thereon, in accordance with some embodiments.

FIG. 4 is a flowchart that may illustrate an example method for processing a substrate having a structure formed thereon, in accordance with some embodiments.

FIG. 5 is a flowchart that may illustrate another example method for processing a substrate having a structure formed thereon, in accordance with some embodiments.

DETAILED DESCRIPTION

Figure 1:
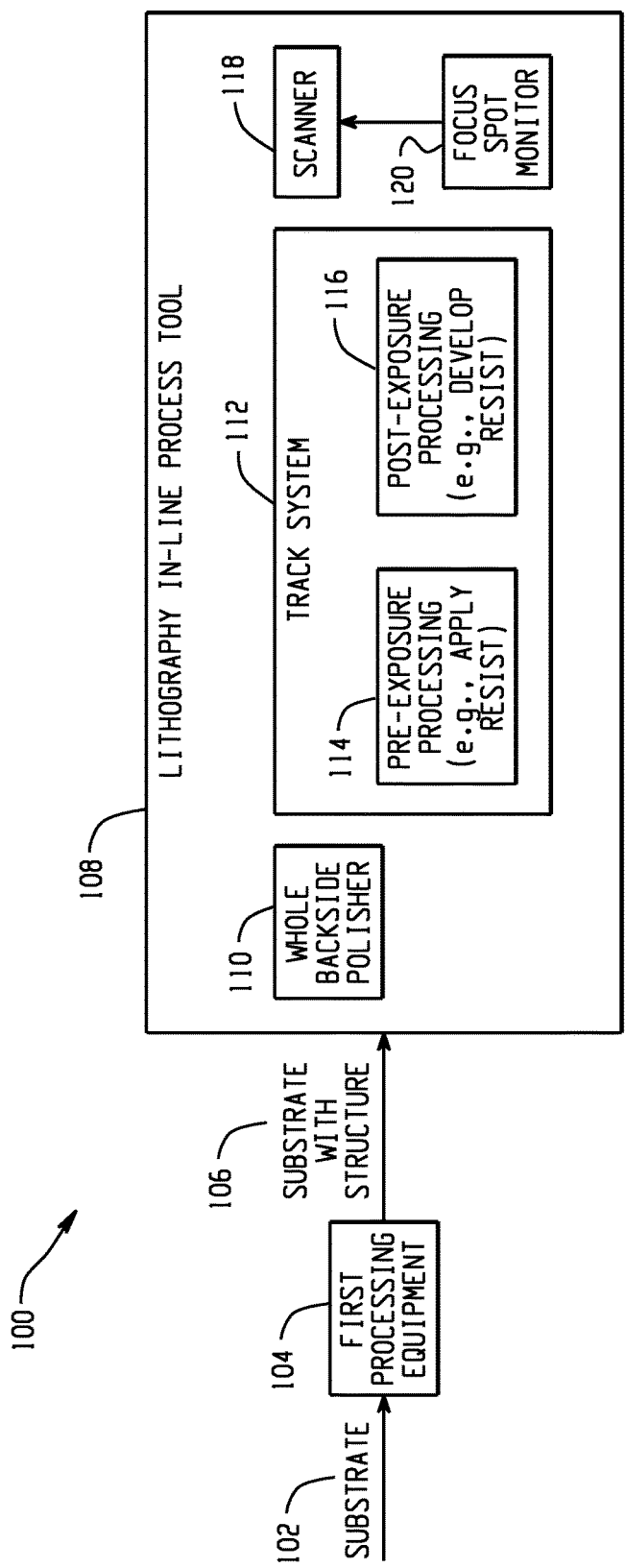
FIG. 1 is a block diagram depicting an example system for processing a substrate, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a block diagram 100 depicting an example system for processing a substrate 102, in accordance with some embodiments. In the example of FIG. 1, the substrate 102 may be received at first processing equipment 104. The first processing equipment 104 may comprise various types of semiconductor processing equipment. For example, the first processing equipment 104 may include a deposition chamber, etching equipment, a semiconductor growth chamber, or the like. In an example, the first processing equipment 104 may comprise a deposition chamber that may be configured to form a structure on the substrate 102. The structure formed on the substrate 102 by the first processing equipment 104 may comprise various forms, such as a planar layer or one or more layers including etched areas or features.

Following the processing at the first processing equipment 104, the substrate with the structure formed thereon 106 may be received at a lithography in-line process tool 108. The lithography in-line process tool 108 may be configured to perform a lithography process on the received substrate with the structure formed thereon 106. The lithography process may be performed via equipment comprising the lithography in-line process tool 108, which may include a scanner 118, a track system 112, and a whole backside polisher 110. Although the scanner 118, track system 112, and whole backside polisher 110 may be depicted in the example of FIG. 1 as being integrated within the lithography in-line process tool 108, in other examples, the pieces of equipment 110, 112, 118 may be physically separated.

The scanner 118 may comprise an exposure tool that is configured to expose the substrate 106 under an optical condition. For example, in a photolithography process, a photoresist may be applied to the substrate 106, and the scanner 118 may thereafter expose the substrate 106 to intense ultraviolet (UV) light. The exposure performed by the scanner 118 may involve use of a mask or a reticle, such that only certain regions of the photoresist are exposed. The exposure to the UV light in the scanner 118 may cause a chemical change in the photoresist that may allow some of the photoresist to be removed via a developer solution.

The track system 112 may include i) equipment 114 for performing pre-exposure processing of the substrate 106, and ii) equipment 116 for performing post-exposure processing of the substrate 106. For example, the equipment 114 may include a tool that applies a layer of resist to the substrate 106, and the equipment 116 may include a tool that develops the exposed resist following the exposure performed in the scanner 118. Other aspects of the track system 112 may be described in greater detail below with reference to FIGS. 3A and 3B.

As illustrated in FIG. 1, the lithography in-line process tool 108 may further include the whole backside polisher 110. The whole backside polisher 110 may be configured to polish an entirety of the backside of the substrate 106 prior to the exposing of the substrate 106 at the scanner 118. The whole backside polisher 110 may be configured to remove topographical features (e.g., roughness or other irregularities) on the backside of the substrate 106, which may thus improve a flatness of the backside. The whole backside polisher 110 may also be configured to remove contamination from the backside of the substrate 106, which may also improve the flatness of the backside.

The improved flatness of the backside of the substrate 106 enabled by the whole backside polisher 110 may help to prevent out-of-focus exposures from occurring at the scanner 118. The exposure of the substrate 106 at the scanner 118 may require precise wafer positioning at the scanner 118. The precise wafer positioning may include positioning the substrate 106 in a direction perpendicular to the surface of the substrate 106. The positioning in this direction may allow the surface of the substrate 106 to be positioned within a depth of focus of an exposure tool of the scanner 118. As the substrate 106 is exposed to exposure light from this direction in the scanner 118, the distance between the substrate 106 and an exposure beam source may have a great influence on focus control. Any deviation of the vertical position of the surface of the substrate 106 being exposed from the required vertical position may lead to defocusing and lithographic structures of reduced quality.

Deviation from the correct vertical position of the surface of the substrate 106 may be caused by topographical features on the backside of the substrate 106. For example, the substrate 106 may have microscopic protrusions (e.g., irregularities, roughness, contamination, etc.) that may be unintentionally produced during preceding processing steps (e.g., processing steps performed at the first processing equipment 104). Such irregularities and topographical features on the backside of the substrate 106 may deteriorate the planarity of the backside of the substrate 106. When the substrate 106 is resting on a wafer chuck in the scanner 118, the deteriorated planarity may cause misalignments of the surface of the substrate 106 in the direction perpendicular to the substrate surface. As a consequence, defocusing may occur at the scanner 118.

Although overall deviations of the height of the substrate 106 supported by the wafer chuck may be corrected by appropriate wafer chuck positioning, local misalignments of the substrate position caused by the irregularities and topographical features of the backside of the substrate 106 may not be corrected in this manner. For example, if the substrate 106 has microscopic protrusions on the backside of the substrate 106, local regions that are slightly elevated compared to other regions of the surface of the substrate 106 may result. In areas away from the microscopic elevations, the substrate 106 may be partially deformed, which may cause these areas to be in direct contact with the wafer chuck (i.e., such that the areas away from the microscopic elevations are not elevated).

In this manner, local regions of defocusing may be caused by the irregularities and topographical features on the backside of the substrate 106. At the local regions of defocusing, the surface of the substrate 106 may be located outside of the depth of focus of the scanner 118. The irregularities and topographical features may be detected by a focus spot monitor 120 that may be included as part of the lithography in-line process tool 108. The focus spot monitor 120 may detect height variations (e.g., peaks) in a wafer map that may be caused by contamination or irregularities on the substrate 106 or the wafer chuck, where the height variations may result in out-of-focus exposures. The focus spot monitor 120 may generate an "FSM" value, and FSM values over a certain threshold (e.g., FSM>0.04) may result in a wafer being discarded.

Various methods have been proposed to address the problem of irregularities, topographical features, and contaminants on the backside of the substrate 106. In alternative systems, various cleaning procedures may be used to clean the backside of the substrate 106 prior to a lithography process. For example, in one alternative system, a scrubber cleaning procedure and a backside/bevel wafer cleaning procedure performed via an etching technique may be used to treat the backside and bevel of the substrate 106 before a photolithography process. However, such cleaning procedures may not adequately remove the irregularities, topographical features, and contaminants from the backside of the substrate 106, and the cleaning procedures may cause additional processing steps and additional equipment to be used, which may be undesirable. Further, the cleaning procedures may cause other problems. For example, the cleaning procedures may cause damage to the front side of the substrate 106. In another example, a selectivity of the cleaning procedure may be suboptimal. The suboptimal selectivity may cause the cleaning procedure to remove not only the contaminants and irregularities on the backside but also portions of the substrate 106 and/or the structure formed thereon, which may be undesirable.

In the example system of FIG. 1, a cleaning procedure may not be used. Specifically, in an example, a cleaning procedure may not be used during a time between i) the forming of the structure on the substrate 102 at the first processing equipment 104, and ii) the exposing of the substrate 106 at the scanner 118. Instead, in the example of FIG. 1, the whole backside polisher 110 may be integrated into the lithography tool 108 and used to polish the backside of the substrate 106 in order to remove the irregularities, topographical features, and contaminants. The removal of the irregularities, topographical features, and contaminants may help to reduce or eliminate the aforementioned local regions of defocusing and allow for a flatter substrate 106 with a lower FSM value. The polishing of the backside of the substrate 106 may thus be configured to reduce a number of local regions of the surface of the substrate 106 that are located outside of a depth of focus of the exposure tool of the scanner 118.

FIG. 2A is a flowchart 200 that may illustrate an example method for processing a substrate having a structure formed thereon, in accordance with some embodiments. At 202, a deposition procedure may be performed to form a structure on a substrate. In other examples, the structure may be formed at 202 using various other procedures and equipment (e.g., etching equipment, a semiconductor growth chamber, or the like). At 204, after the forming of the structure on the substrate, a photolithography procedure may be performed using the substrate.

The photolithography procedure performed at 204 may include polishing a backside of the substrate, where the polishing may be configured to remove a topographical feature of the backside or to remove a contaminant from the backside. The lithography procedure performed at 204 may also include steps performed at a track system. The steps performed at the track system may include pre-exposure processing of the substrate (e.g., applying a photoresist to the substrate) and post-exposure processing of the substrate (e.g., developing the photoresist after UV exposure). The lithography procedure performed at 204 may also include exposing the substrate under an optical condition at a scanner or another exposure tool (e.g., a stepper).

As indicated in the flowchart 200, the example of FIG. 2A may not include a cleaning procedure. Specifically, to the extent that a cleaning procedure may be performed in the example of FIG. 2A, the cleaning procedure may not be a procedure that is configured to clean a backside of the substrate to remove irregularities or contamination therefrom. Rather than including a cleaning procedure, the example of FIG. 2A may include the polishing of the entirety of the backside of the substrate for FSM improvement in semiconductor applications. As described above, with reference to FIG. 1, the polishing may reduce local regions of defocusing during the exposure process, thus enabling a photolithography process with improved results. It is further noted that the polisher used to polish the substrate may be integrated into a lithography in-line processing tool, where the in-line processing tool may also include the aforementioned track system and scanner.

FIG. 2B is a flowchart 250 that may illustrate an alternative method for processing a substrate having a structure formed thereon. In the alternative method depicted in FIG. 2B, a polishing procedure may not be used. Instead, after forming a structure on a substrate at 252 (e.g., via a deposition procedure), a cleaning procedure may be performed prior to a photolithography procedure in order to clean a backside of the substrate. At 254, the cleaning may include a cleaning procedure performed using a scrubber. Specifically, the scrubber used at 254 may be a brush scrubber including brush bristles (e.g., nylon brush bristles) used to remove particles from the substrate. At 256, following the scrubber cleaning procedure, a backside and bevel cleaning procedure may be performed. As indicated in FIG. 2B, the backside and bevel cleaning procedure may be performed using DNS Electronics equipment. The DNS Electronics equipment used in performing the backside and bevel cleaning may be configured to perform a wet etch cleaning procedure (e.g., a wet etch cleaning procedure utilizing hydrofluoric acid to remove an oxide from the wafer). In other examples, the DNS Electronics equipment may be used in performing other types of cleaning procedures.

At 258, an additional backside cleaning procedure may be performed. As indicated in FIG. 2B, the backside cleaning procedure performed at 258 may utilize Lam Research equipment. The Lam Research equipment used in performing the backside cleaning may be configured to remove remaining particles and/or contaminants not already removed at cleaning steps 254, 256. At 260, after the cleaning procedure performed at 258, a photolithography procedure may be performed using the substrate. The photolithography procedure performed at 260 may include steps performed at a track system. The steps performed at the track system may include pre-exposure processing of the substrate and post-exposure processing of the substrate. The lithography procedure performed at 260 may also include exposing the substrate under an optical condition at a scanner or another exposure tool. The photolithography step 260 of FIG. 2B may not include a polishing step, in contrast to the photolithography step 204 of FIG. 2A.

Figure 3A:
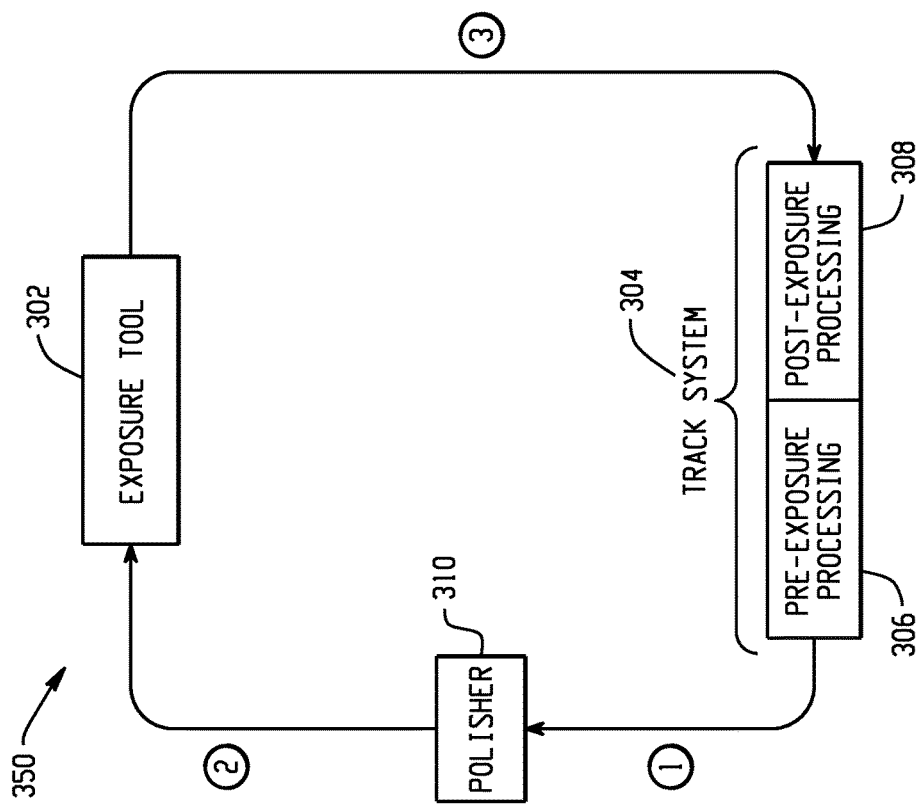
FIG. 3A is a block diagram that may illustrate an example movement of a wafer within an in-line lithography system, in accordance with some embodiments.

FIG. 3A is a block diagram 300 that may illustrate an example movement of a wafer within an in-line lithography system, in accordance with some embodiments. In FIG. 3A, the wafer may be received at a whole backside polisher 310, where the backside of the wafer may be polished to remove irregularities and contaminants. Prior to the transferring of the wafer to the whole backside polisher 310, a structure may be deposited or otherwise formed on the wafer. As indicated by the circled number "one" in FIG. 3A, the wafer may be moved to a track system 304 after the polishing at the polisher 310. The track system 304 may be a wafer processing tool that provides pre-exposure processing 306 and post-exposure processing 308 on the wafer. The pre-exposure processing 306 may include applying a photoresist to the wafer, baking the wafer, annealing the wafer, or applying an adhesion promoter to the wafer, among other procedures.

As indicated by the circled number "two" in FIG. 3A, the wafer may be moved to an exposure tool 302 after the pre-exposure processing 306 at the track system 304. The exposure tool 302 may be a scanner, and the scanner may include various optical systems (e.g., an optical photolithography (OPL) scanner) for exposing the wafer. As indicated by the circled number "three" in FIG. 3A, the wafer may be moved back to the track system 304 after the exposure of the wafer at the scanner 302. After returning to the track system 304, the wafer may undergo post-exposure processing 308. The post-exposure processing 308 may include, for example, post exposure baking, annealing, developing photoresist, hard baking, or etching, among other procedures.

In FIG. 3A, the whole backside polisher 310, the track system 304, and the exposure tool 302 may be integrated as part of a lithography in-line process tool, and the whole backside polisher 310 may be configured to improve an FSM value for a semiconductor application. With the integration of the whole backside polisher 310 into the lithography in-line process tool, a cleaning procedure performed in alternative systems (e.g., a scrubber clean and/or backside/bevel wafer clean) may be replaced with the backside wafer polishing procedure described above. The replacing of the cleaning procedure with the polishing procedure may be desirable for a number of reasons. The elimination of the cleaning stage may eliminate costly equipment and time spent cleaning the wafers. The polishing performed at the whole backside polisher 310 may be configured to protect a front side of the wafers, which may thus eliminate a front side damage concern that may be inherent in certain wafer cleaning procedures. The protecting may include, for example, techniques used to mask the front side of the wafer to prevent damage and various other techniques that prevent the polishing procedure from damaging the front side (e.g., simply not allowing the front side to come into contact with any equipment or materials used in the polishing procedure). Additionally, the polishing procedure may eliminate a selectivity concern that may be inherent in certain wafer cleaning procedures. For example, if a cleaning procedure is of low selectivity, the cleaning procedure may not be selective to only remove contaminants and irregularities from the wafer, and the cleaning procedure may instead also remove portions of the wafer and structure formed thereon, which may be undesirable.

As explained above, in the example of FIG. 3A, a wafer cleaning procedure may not be used. Specifically, in an example, a cleaning procedure to clean the backside of the wafer may not be performed during a period of time between i) the forming of the structure on the wafer (e.g., at deposition equipment prior to the polisher 310), and ii) the exposing of the wafer at the exposure tool 302. In another example, a cleaning procedure to clean the backside of the wafer may not be performed in the system of FIG. 3A prior to the post-exposure processing 308, and the cleaning procedure may also not be performed during the post-exposure processing 308.

Figure 3B:
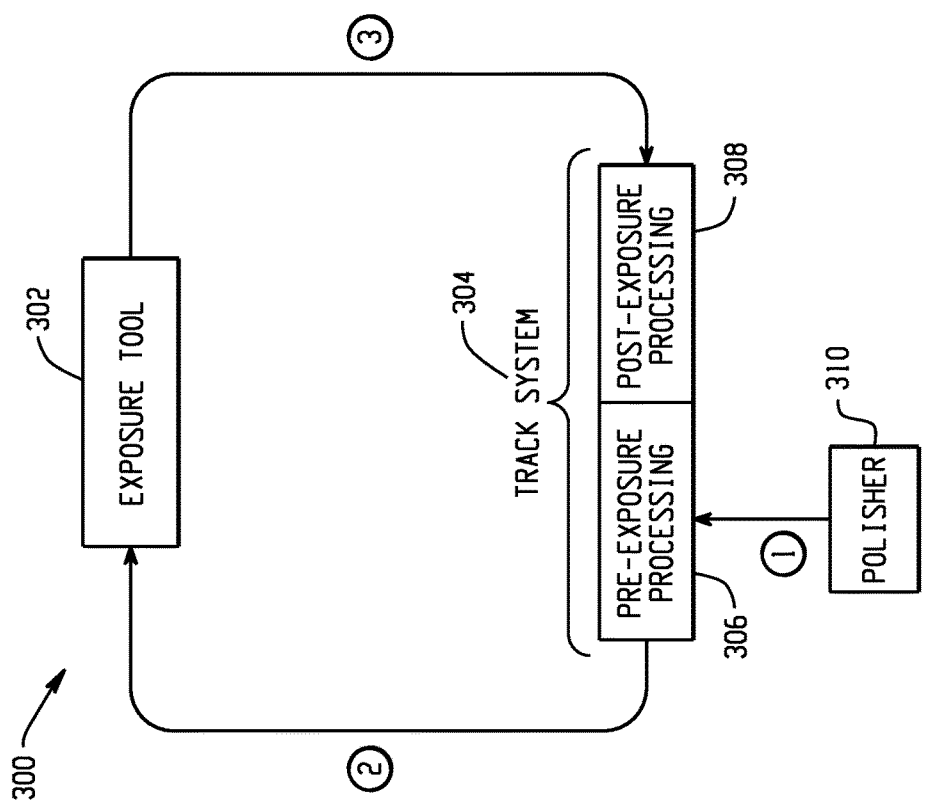
FIG. 3B is a block diagram that may illustrate another example movement of a wafer within an in-line lithography system, in accordance with some embodiments.

FIG. 3B is a block diagram 350 that may illustrate another example movement of a wafer within an in-line lithography system, in accordance with some embodiments. In FIG. 3B, the wafer may be received at a track system 304. Prior to the transferring of the wafer to the track system 304, a structure may be deposited or otherwise formed on the wafer. At the track system 304, pre-exposure processing 306 may be performed. As indicated by the circled number "one" in FIG. 3B, the wafer may be moved to a whole backside polisher 310 after the pre-exposure processing 306. At the whole backside polisher 310, the backside of the wafer may be polished to remove irregularities and contaminants.

As indicated by the circled number "two" in FIG. 3B, the wafer may be moved to an exposure tool 302 after the polishing performed at the whole backside polisher 310. The exposure tool 302 may be a scanner for exposing the wafer. As indicated by the circled number "three" in FIG. 3B, the wafer may be moved back to the track system 304 after the exposure of the wafer at the exposure tool 302. After returning to the track system 304, the wafer may undergo post-exposure processing 308. Similar to FIG. 3A, in FIG. 3B, the whole backside polisher 310, the track system 304, and the exposure tool 302 may be considered to be integrated within a lithography in-line process tool. With the integration of the whole backside polisher 310 into the lithography in-line process tool, a cleaning procedure performed in alternative systems may be replaced with the backside wafer polishing procedure.

FIG. 4 is a flowchart 400 that may illustrate an example method for processing a substrate having a structure formed thereon, in accordance with some embodiments. At 402, the substrate may be received from first processing equipment, where the first processing equipment may have formed the structure on the substrate. At 404, a lithography process may be performed on the received substrate. The lithography process may include, at 406, polishing a backside of the substrate prior to an exposing of the substrate. The polishing may be configured to remove a topographical feature of the backside of the substrate or to remove a contaminant from the backside of the substrate. The lithography process may further include, at 408, performing, at a track system, pre-exposure processing of the substrate prior to the exposing of the substrate. The lithography process may also include, at 410, the exposing of the substrate under an optical condition. The exposing may be performed using a scanner system. At 412, post-exposure processing of the substrate after the exposing of the substrate may be performed at the track system as part of the lithography process. The substrate may not undergo a cleaning procedure during a period of time between i) the forming of the structure on the substrate, and ii) the exposing of the substrate.

FIG. 5 is a flowchart 500 that may illustrate another example method for processing a substrate having a structure formed thereon, in accordance with some embodiments. At 502, the substrate may be received from first processing equipment, where the first processing equipment may have formed the structure on the substrate. At 504, a lithography process may be performed on the received substrate. The lithography process may include, at 506, polishing a backside of the substrate prior to an exposing of the substrate. The polishing may be configured to remove a topographical feature of the backside of the substrate or to remove a contaminant from the backside of the substrate. At 508, the lithography process may further include exposing the substrate under an optical condition. The backside of the substrate may not undergo a cleaning procedure during a period of time between i) the forming of the structure on the substrate, and ii) the exposing of the substrate.

The present disclosure is directed to integrating a backside polisher into a lithography tool. The backside polisher may be used to polish an entire backside of a substrate, thus allowing the backside of the wafer to have a flatter topography. The flatter topography may help to eliminate out-of-focus exposures during the lithography process. The backside polisher may eliminate a need for a scrubber clean, a backside/bevel wafer clean, or another cleaning process for backside wafer cleaning that is typically used prior to the lithography process. Additionally, the backside polisher may be configured to protect a front side of the substrate from being damaged during the polishing of the backside.

The present disclosure is directed to a method of processing a substrate having a structure formed thereon and a system for processing a substrate. In an embodiment of a method of processing a substrate having a structure formed thereon, the substrate is received from first processing equipment, where the first processing equipment has formed the structure on the substrate. A lithography process is performed on the received substrate. The lithography process includes exposing the substrate under an optical condition. The lithography process further includes polishing a backside of the substrate prior to the exposing of the substrate, where the polishing is configured to remove a topographical feature of the backside of the substrate or to remove a contaminant from the backside of the substrate. The backside of the substrate does not undergo a cleaning procedure during a period of time between i) the forming of the structure on the substrate, and ii) the exposing of the substrate.

In another embodiment of a method of processing a substrate having a structure formed thereon, the substrate is received from first processing equipment, where the first processing equipment has formed the structure on the substrate. A lithography process is performed on the received substrate, where the lithography process includes exposing the substrate under an optical condition. The exposing is performed using a scanner system. The lithography process also includes performing, at a track system, pre-exposure processing of the substrate prior to the exposing of the substrate. Post-exposure processing of the substrate after the exposing of the substrate is also performed at the track system as part of the lithography process. The lithography process further includes polishing a backside of the substrate prior to the exposing of the substrate, where the polishing is configured to remove a topographical feature of the backside of the substrate or to remove a contaminant from the backside of the substrate. The substrate does not undergo a cleaning procedure during a period of time between i) the forming of the structure on the substrate, and ii) the exposing of the substrate.

In an embodiment of a system for processing a substrate, the system includes first processing equipment configured to form a structure on the substrate. The system also includes a lithography system configured to i) receive the substrate from the first processing equipment, and ii) perform a lithography process on the received substrate. The lithography system includes an exposure tool configured to expose the substrate under an optical condition. The lithography system also includes a polisher configured to polish a backside of the substrate prior to the exposing of the substrate. The polishing is configured to remove a topographical feature of the backside of the substrate or to remove a contaminant from the backside of the substrate. The backside of the substrate does not undergo a cleaning procedure during a period of time between i) the forming of the structure on the substrate, and ii) the exposing of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of processing a substrate having a structure formed thereon, the method comprising:
   receiving the substrate from a first processing equipment, the first processing equipment having formed the structure on the substrate; and
   performing, by a lithography in-line process tool, a lithography process on the received substrate, the lithography process including:
      providing pre-exposure processing of the substrate, including applying a photoresist, within a track system,
      exposing the substrate under an optical condition,
      polishing a backside of the substrate after the pre-exposure processing and prior to the exposing of the substrate and while the photoresist is present on the substrate, and
      providing post-exposure processing of the substrate after the exposing, wherein the substrate does not undergo any cleaning procedure, other than the polishing, between the forming of the structure and the post-exposure processing and is uncleaned during the post-exposure processing, such that the post-exposure processing comprises post-exposure processing of the uncleaned substrate.

2. The method of claim 1, wherein an entirety of the backside of the substrate is polished.

3. The method of claim 1, wherein the exposing of the substrate is performed by an exposure tool, the lithography process further includes positioning a surface of the substrate within a depth of focus of the exposure tool, and the polishing of the backside of the wafer is configured to reduce a number of regions of the surface of the substrate that are located outside of the depth of focus.

4. The method of claim 1, wherein the exposing of the substrate is performed by an exposure tool and the polishing of the backside of the substrate is performed by a polisher.

5. The method of claim 1, wherein the exposing of the substrate is performed by an exposure tool, the polishing of the backside of the substrate is performed by a polisher, and the lithography process further includes:
   providing post-exposure processing of the substrate within the track system after the exposing of the substrate.

6. The method of claim 5, wherein the track system receives the substrate from the polisher after the polishing of the backside of the substrate, and the track system provides the substrate to the exposure tool after the providing of the pre-exposure processing.

7. The method of claim 5, wherein the substrate does not undergo the cleaning procedure during the post-exposure processing.

8. The method of claim 5, wherein the polisher provides the substrate to the exposure tool after the polishing of the backside of the substrate.

9. The method of claim 1, further comprising:
   protecting a front side of the substrate from being damaged during the polishing of the backside.

10. A method of processing a substrate having a structure formed thereon, the method comprising:
    receiving the substrate from a first processing equipment, the first processing equipment having formed the structure on the substrate; and
    performing, by a lithography in-line process tool, a lithography process on the received substrate, the lithography process including:
       exposing the substrate under an optical condition, wherein the exposing is performed using a scanner system,
       performing, at a track system, pre-exposure processing of the substrate, including applying a photoresist, prior to the exposing of the substrate,
       performing, at the track system, post-exposure processing of the substrate after the exposing of the substrate,
       polishing a backside of the substrate after the pre-exposure processing and prior to the exposing of the substrate and while the photoresist is present on the substrate, and
       providing post-exposure processing of the substrate after the exposing, wherein the substrate does not undergo any cleaning procedure, other than the polishing, between the forming of the structure and the post-exposure processing and is uncleaned during the post-exposure processing, such that the post-exposure processing comprises post-exposure processing of the uncleaned substrate.

11. A method comprising:
    polishing by a polisher of a lithography in-line process tool a backside of a substrate using a polishing operation that reduces a focus spot monitor (FSM) value of a backside of the substrate and that avoids substantial damage to a structure formed on a front side of the substrate;
    pre-exposure processing the substrate, including applying a photoresist, at a track system of the lithography in-line process tool;
    exposing, by an exposure tool of the lithography in-line process tool, the substrate under an optical condition, wherein the polishing is performed after the pre-exposure processing and while the photoresist is present on the substrate; and
    providing post-exposure processing of the substrate after the exposing, wherein the substrate does not undergo any cleaning procedure, other than the polishing, between forming of the structure and the post-exposure processing and is uncleaned during the post-exposure processing, such that the post-exposure processing comprises post-exposure processing of the uncleaned substrate.

12. The method of claim 11, wherein the post-exposure processing of the substrate is performed at the track system of the lithography in-line process tool.

13. The method of claim 12, further comprising, after exposing, moving by the lithography in-line process tool the substrate to the track system of the lithography in-line process tool, at which the track system performs post-exposure processing of the substrate.

14. The method of claim 11, further comprising, after polishing, moving by the lithography in-line process tool the substrate to the exposure tool.

15. The method of claim 11, further comprising, after pre-exposure processing the substrate, moving by the lithography in-line process tool the substrate to the polisher.

16. The method of claim 11, further comprising, after polishing, moving by the lithography in-line process tool the substrate to the track system of the lithography in-line process tool.

17. The method of claim 11, further comprising, after pre-exposure processing the substrate, moving by the lithography in-line process tool the substrate to the exposure tool.

18. The method of claim 11, further comprising, prior to polishing, receiving the substrate at the track system of the lithography in-line process tool.

19. The method of claim 11, further comprising, prior to pre-exposure processing the substrate, receiving the substrate at the polisher.

20. The method of claim 11, further comprising detecting by an FSM of the lithography in-line process tool the backside of the substrate and generating an FSM value based on the result of the detection.

21. A method of processing a substrate having a structure formed thereon, the method comprising:

receiving the substrate from a first processing equipment, the first processing equipment having formed the structure on the substrate; and performing, by a lithography in-line process tool, a lithography process on the received substrate, the lithography process including:

providing pre-exposure processing of the substrate, including applying a photoresist, within a track system, exposing the substrate under an optical condition, polishing a backside of the substrate after the pre-exposure processing and prior to the exposing of the substrate and while the photoresist is present on the substrate, the polishing being configured to remove a topographical feature of the backside of the substrate or to remove a contaminant from the backside of the substrate, and providing post-exposure processing of the substrate after the exposing, wherein the substrate does not undergo any cleaning procedure, other than the polishing, between the forming of the structure and the post-exposure processing and is uncleaned during the post-exposure processing, such that the post-exposure processing comprises post-exposure processing of the uncleaned substrate.

* * * * *